(12) United States Patent
Szu

(10) Patent No.: US 7,510,427 B2
(45) Date of Patent: Mar. 31, 2009

(54) ELECTRICAL CONNECTOR WITH GUIDING PORTION

(75) Inventor: Ming-Lun Szu, Tu-cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/012,637

(22) Filed: Feb. 4, 2008

(65) Prior Publication Data

US 2008/0188097 A1    Aug. 7, 2008

(51) Int. Cl.
H05K 1/00 (2006.01)
(52) U.S. Cl. .......................... 439/526; 439/70
(58) Field of Classification Search ............ 439/70, 439/71, 526
See application file for complete search history.

(56) References Cited

U.S. PATENT DOCUMENTS 5,221,209 A * 6/1993 D'Amico .................. 439/71
6,132,220 A * 10/2000 McHugh et al. ............ 439/526
6,164,980 A * 12/2000 Goodwin .................. 439/70
6,561,818 B1 * 5/2003 Howell et al. .............. 439/66

FOREIGN PATENT DOCUMENTS

CN    200972988    11/2007

* cited by examiner

Primary Examiner—Briggitte R Hammond
(74) Attorney, Agent, or Firm—Wei Te Chung

(57) ABSTRACT

An electrical connector (1) for connecting an LGP (12) to a printed circuit board includes a housing having a bottom wall (100), side walls (101) and a number of contacts (11) mounted into the bottom wall. The side walls have a first side wall (1011) including a number of spring plates (104) assembled thereto, and a second side wall (1012) opposite to the first side wall having a guiding portion (102) disposed thereon. A receiving space (105) is defined between the guiding portion and the bottom wall for receiving the LGP.

11 Claims, 5 Drawing Sheets

ELECTRICAL CONNECTOR WITH GUIDING PORTION

BACKGROUND OF THE INVENTION

1. Field of the Invention

The present invention is directed to an art of an electrical connector for connecting a land grid package (LGP) to a printed circuit board.

2. Description of Prior Arts

A China Patent No. 200972988 issued on Nov. 7, 2007, discloses an electrical connector for connecting an LGP to a printed circuit board. The electrical connector has a housing comprising a bottom wall, four side walls and a receiving room defined therebetween for receiving the LGP. The electrical connector comprises a plurality of spring plates assembled to the side walls for resisting against the LGP and a number of contacts mounted into the bottom wall. Each contact has a spring pin extending outward from the bottom wall for contacting with the LGP.

However, while the LGP is pressed downward, it is difficult to guide and control a horizontal movement of the LGP.

Hence, it is desirable to provide an improved electrical connector to overcome the aforementioned disadvantages.

SUMMARY OF THE INVENTION

An object of the present invention is to provide an electrical connector that can effectively guiding a LGP into a housing thereof.

To achieve the above object, an electrical connector for connecting a LGP to a printed circuit board comprises a housing having a bottom wall, side walls and a plurality of contacts mounted into the bottom wall. The side walls comprise a first side wall having a plurality of spring plates assembled thereto, and a second side wall opposite to the first side wall having a guiding portion disposed thereon. A receiving space is defined between the guiding portion and the bottom wall for receiving the LGP.

When the LGP is pushed downward, the spring plates assembled to the first side wall are provided a flexible force to push the LGP against second side wall of the housing. The second side wall has a guiding portion for guiding the LGP into the receiving space of the housing. That is, we can effectively control a horizontal movement of the LGP by the guiding portion.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
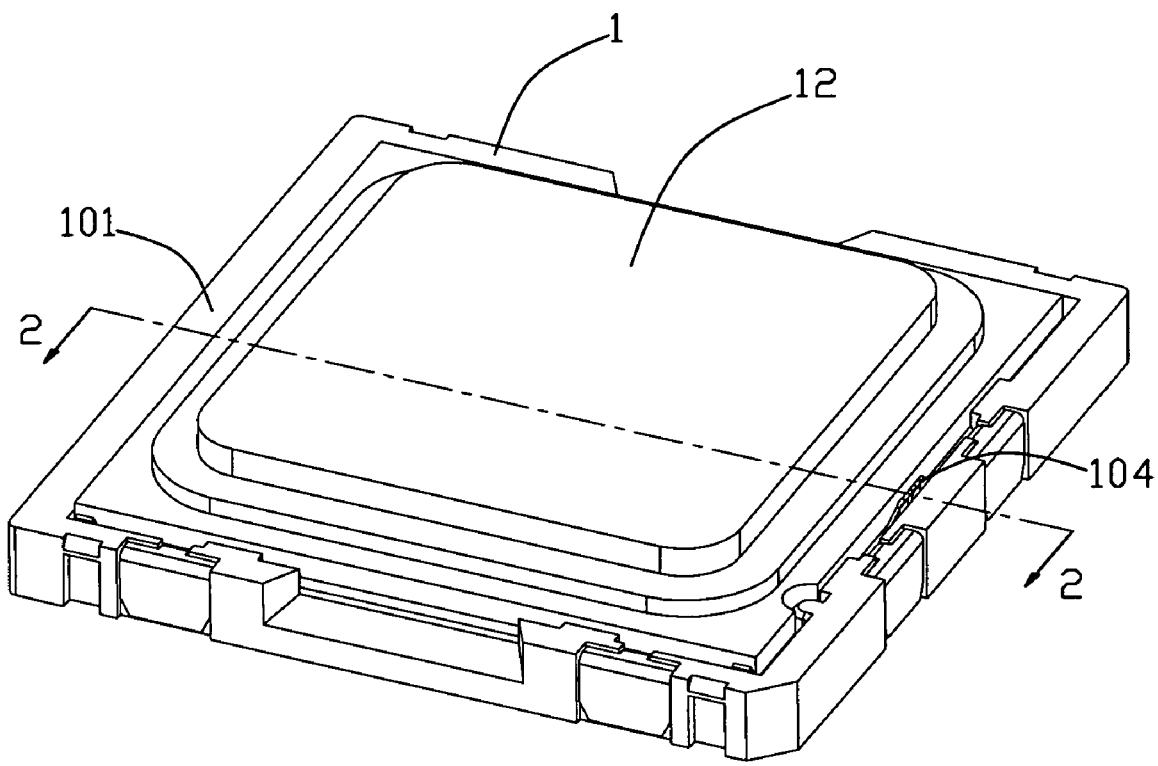
FIG. 1 is an assembled perspective view of an electrical connector of the present invention with an LGP mounted thereto.
Figure 2:
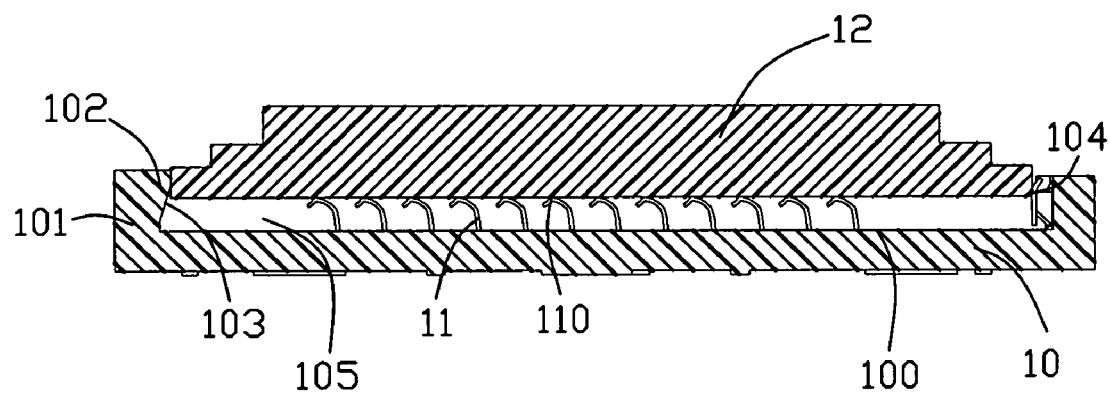
FIG. 2 is a cross-sectional view of the electrical connector with the LOP inserting into the electrical connector, taken along a line of 2-2.
Figure 3:
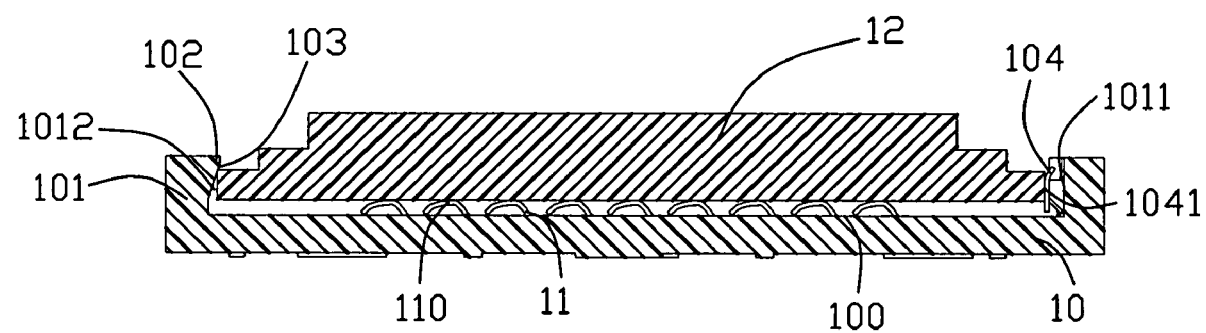
FIG. 3 is cross-sectional view of the electrical connector with a LGP absolutely mounted into of the electrical connector.
Figure 4:
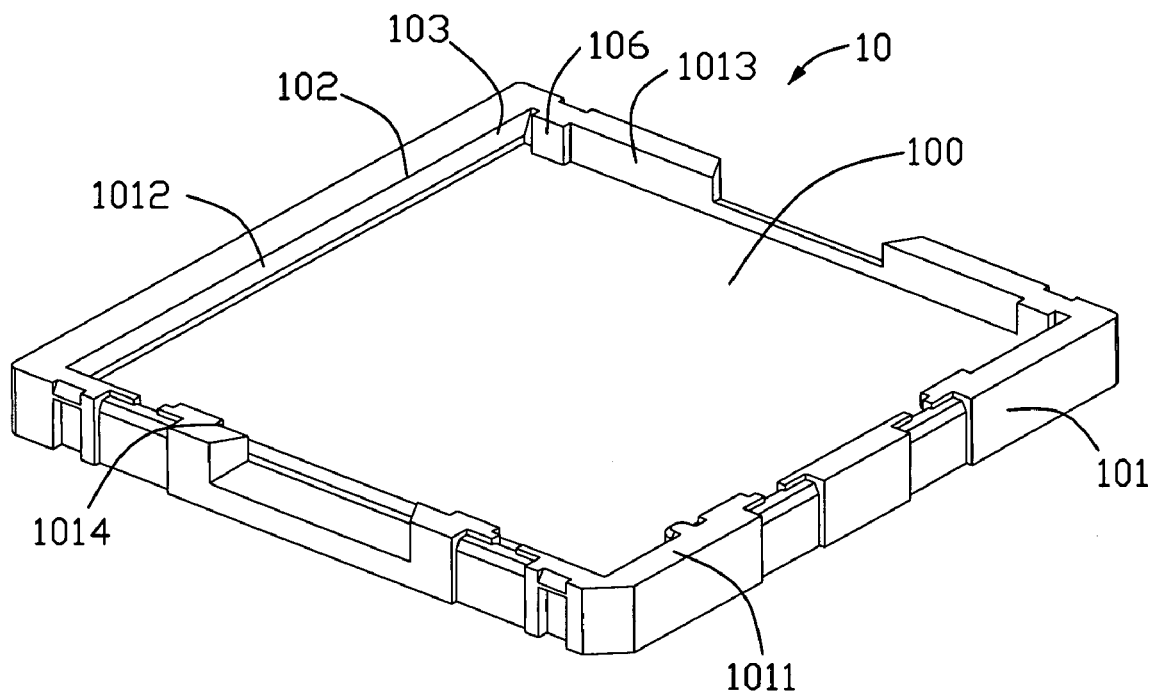
FIG. 4 is a perspective view of a housing of the electrical connector.
Figure 5:
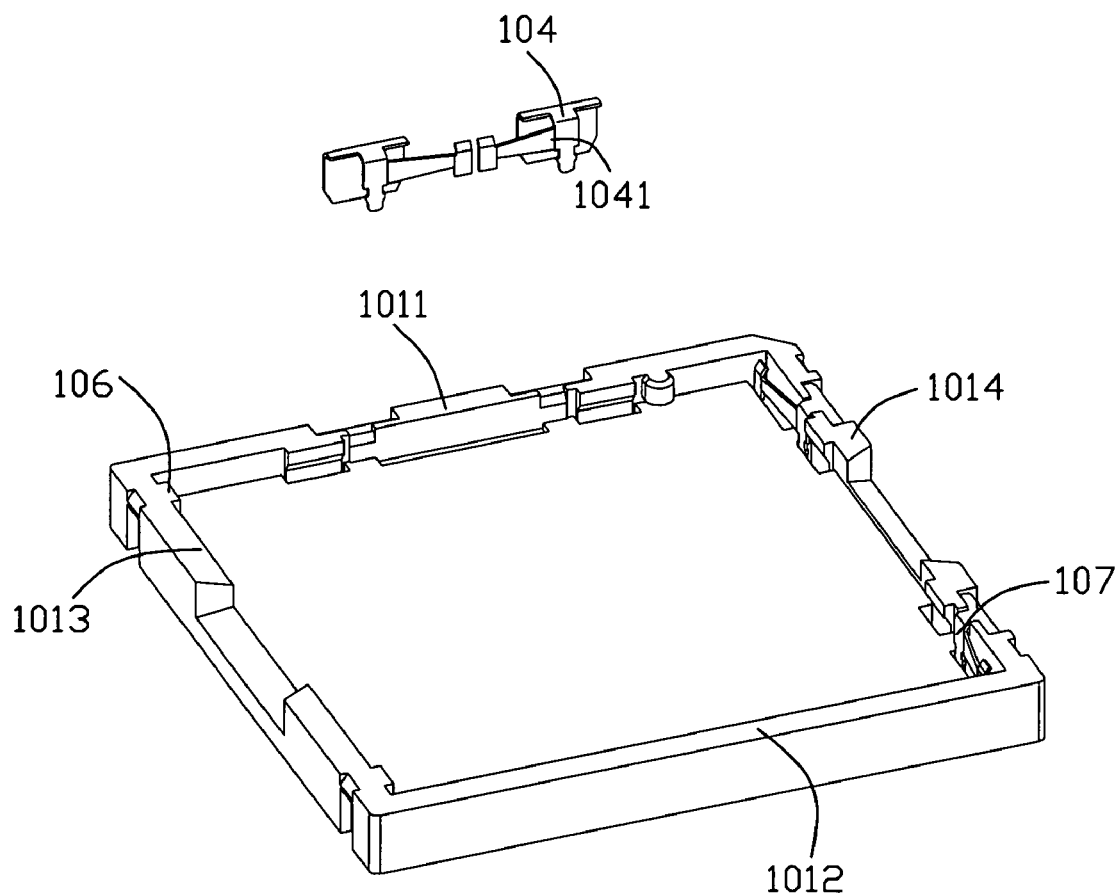
FIG. 5 is a perspective view of the housing of the electrical connector, taken from another aspect.

Reference will now be made to the drawing figures to describe the present invention in detail. Referring to FIGS. 1-4, an electrical connector 1 for connecting a LGP 12 to a printed circuit board (not shown) comprises a housing 10 and a plurality of contacts 11 assembled into the housing 10.

The housing 10 is of rectangular configuration and has a bottom wall 100, four side walls 101 extending upwardly form the bottom wall 100. A plurality of passageways (not labeled) are defined in the bottom wall 100 for receiving the contacts 11 therein. The contact 11 has a contacting portion 110 extending upwardly from the bottom wall 100.

The side walls 101 include a first side wall 1011 having a plurality of spring plates 104 assembled thereto for resisting against a side edge of the LGP 12, and a second side wall 1012 opposite to the first side wall 1011 having a guiding portion 102 disposed thereon. In another embodiment, the guiding portion 102 is formed with a plurality of non-continuous second guiding portions disposed on the second side wall 1012. The housing 10 further has a receiving space 105 defined between the guiding portion 102 and the bottom wall 100 for receiving the LGP 12. In this embodiment, the housing 10 and the guiding portion 102 are integrated together as a whole. In another embodiment, the guiding portion 102 and the housing 10 are made from different materials.

The side walls 101 include a third side wall 1013 and a fourth side wall 1014 which are adjacent to the first and second side wall 1011 and 1012. The third side wall 1013 has a protrusion 106 engaging with a recess (not labeled) defined on a side edge portion of the LGP 12 for anti-mismating. The fourth side wall 1014 has a pair of second spring plates 107 mounted therein for coupling with the LGP 12.

The spring plate 104 has a base plate (not shown) mounted into the first side wall 1011 and a flexible plate 1041 extending from the base plate and projecting into the receiving space 105 for resisting against the LGP 12. The guiding portion 102 extends obliquely upwardly from the lower portion of the inner surface of the second side wall 1012 and has a sliding surface 103. The top tip of the guiding portion 102 extends into the receiving space 105. In another embodiment, the guiding portion 102 is of arced configuration.

During assembly, when the LGP 12 is pushed downwardly, the flexible plate 1041 resists against the LGP 12, and the LGP 12 is guided into the receiving space 105 by the guiding portion 102 of the second side wall 1012. That is, we can control the movement of the LGP 12 effectively by the guiding portion 102.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An electrical connector for connecting a land grid package (LGP) to a printed circuit board, comprising:

a housing comprising:

a bottom wall;

side walls including a first side wall comprising a plurality of spring plates assembled thereto, and a second side wall opposite to the first side wall having a guiding portion disposed thereon, said guiding portion extending obliquely upwardly from the lower potion of the second side wall; and a receiving space defined between the guiding portion and the bottom wall for receiving the LGP; and a plurality of contacts mounted into the bottom wall of the housing and contacting with the LGP.

2. The electrical connector as claimed in claim 1, wherein said top tip of the guiding portion projects toward the receiving space.

3. The electrical connector as claimed in claim 1, wherein said guiding portion is of arced configuration.

4. The electrical connector as claimed in claim 1, wherein said guiding portion is formed with a plurality of guiding sections.

5. The electrical connector as claimed in claim 1, wherein said spring plate has a base plate mounted into the first side wall and a flexible plate extending into the receiving space for resisting against the LGP.

6. The electrical connector as claimed in claim 1, wherein each contact comprises a contacting portion extending upwardly from the bottom wall of the housing.

7. The electrical connector as claimed in claim 1, wherein said side walls further comprise a third side wall and a fourth side wall, and wherein the third and the fourth side walls respectively has at least one protrusion disposed thereon, the LGP comprises corresponding recesses defined on an edge portion thereof for engaging with the protrusions.

8. The electrical connector as claimed in claim 1, wherein said housing and the guiding portion are integrated together as a whole.

9. The electrical connector as claimed in claim 1, wherein said guiding portion and the housing are made from different materials.

10. An electrical connector assembly comprising:

a housing having a peripheral wall and an insulative base commonly defining a receiving cavity;

a plurality of contacts disposed in the housing with contacting sections exposed into the receiving cavity;

an electronic package received in the receiving cavity and experiencing an upward force generated by said contacting section;

an urging device located around one position of said peripheral wall to push the electronic package in one transverse direction; and a confinement structure formed around another position of said peripheral wall opposite to said one position to abut against the electronic package at least in an upward direction of said electronic package so as to prevent upward movement of said electronic package due to said upward force for assuring reliable engagement between the contacting sections and the electronic package.

11. An electrical connector for connecting a land grid package (LGP) to a printed circuit board, comprising:

a housing comprising:

a bottom wall;

side walls including a first side wall comprising a plurality of spring plates assembled thereto, and a second side wall opposite to the first side wall having a guiding portion disposed thereon; and a receiving space defined between the guiding portion and the bottom wall for receiving the LGP; and a plurality of contacts mounted into the bottom wall of the housing and contacting with the LGP; wherein said spring plate has a base plate mounted into the first side wall and a flexible plate extending into the receiving space for resisting against the LGP.

* * * * *